Feb. 8, 1966 M. COOPER 3,234,484
FREQUENCY CALIBRATOR FOR CRYSTAL OSCILLATORS
Filed Feb. 17, 1964
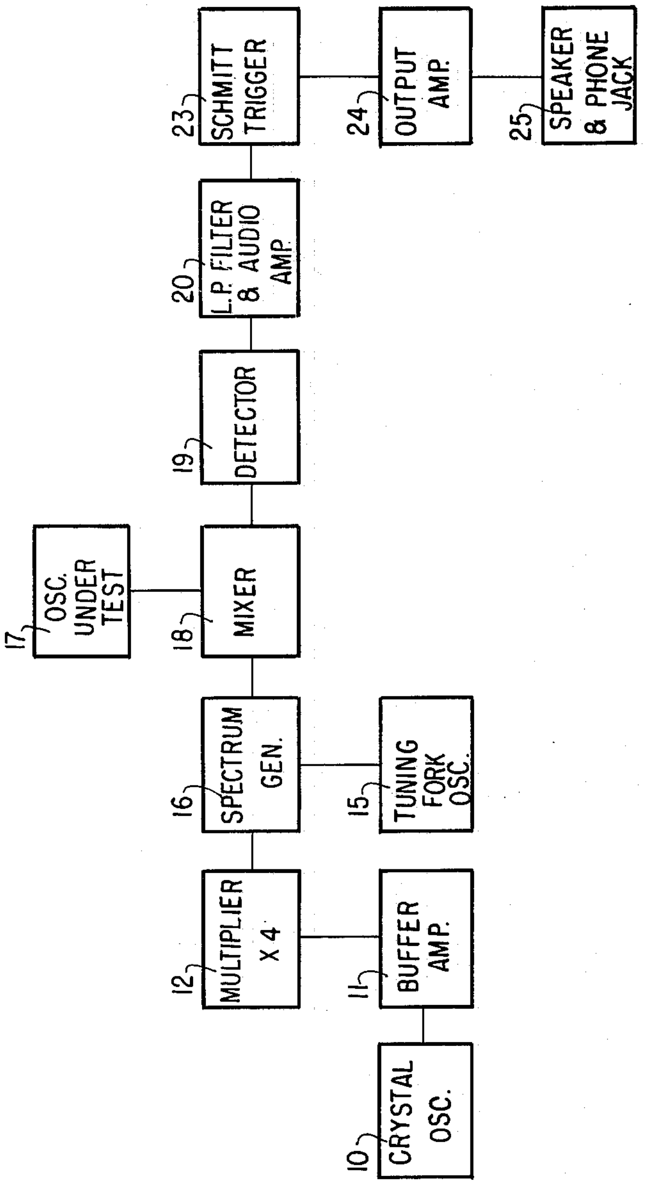
INVENTOR.
MARTIN COOPER
BY Mueller & Aichele
ATTYS.

United States Patent Office 3,234,484

Patented Feb. 8, 1966

3,234,484

FREQUENCY CALIBRATOR FOR CRYSTAL OSCILLATORS

Martin Cooper, Skokie, Ill., assignor to Motorola, Inc., Franklin Park, Ill., a corporation of Illinois Filed Feb. 17, 1964, Ser. No. 345,260
5 Claims. (Cl. 331—44)

This invention relates to a frequency calibrator for crystal oscillators and in particular to a frequency calibrator for a crystal oscillator which may operate at any one of a series of discrete frequencies separated by a common difference frequency.

In communications by radio it is customary to allocate many channels, separated in frequency by a common difference frequency, to a particular communications service. The equipment used in this service may be required to operate on any one of the channels assigned to that service.

An example of this is mobile telephone service in which 11 channels, each separated by a common difference frequency, are allocated. In order to meet system requirements for frequency accuracy and stability, it is necessary to use a separate crystal oscillator for each channel and each of the oscillators must be periodically calibrated. The crystals used are unheated and thus vary in frequency with temperature. If conventional frequency measuring and calibrating equipment is used for installation and maintenance, the calibration of the individual crystal oscillators to the required accuracy can become complicated, time consuming and expensive.

It is therefore, an object of this invention to provide an accurate, rapid and simple system for frequency calibration of crystal oscillators which may be resonant at any one of a series of discrete frequencies separated by a common difference frequency.

Another object of this invention is to provide a system for frequency calibration of crystal oscillators which can accurately calibrate oscillators using unheated crystals.

A further object of this invention is to provide a crystal oscillator frequency calibrator which generates audible transients at sub-audible frequencies for indicating the difference of the frequency of the crystal calibrated from its desired frequency.

A feature of this invention is the provision of a frequency calibrator for oscillators resonant at any one of a series of discrete frequencies, with a first oscillator resonant at one of the discrete frequencies and a second oscillator resonant at the common difference frequency. The output signals from the oscillator are mixed to generate the series of discrete frequencies.

Another feature of this invention is the provision of a crystal oscillator frequency calibrator with a crystal oscillator having substantially the same temperature characteristics as the oscillators to be calibrated.

The invention is illustrated in the drawing which is a block diagram of the crystal oscillator calibrator.

In practicing this invention a frequency calibrator is provided to calibrate crystal oscillators which may have any one of a series of discrete frequencies, separated by a fixed difference frequency. A highly accurate crystal oscillator generates an output signal at one of the frequencies in the series of discrete frequencies. A second oscillator is also provided which generates the common difference frequency. The outputs of the two oscillators are combined in a spectrum generator to develop a signal spectrum including the series of discrete frequencies. The signal spectrum and the oscillator to be calibrated are coupled to a mixer which mixes the signals to produce a series of sum and difference frequencies. The output of the mixer is detected and then filtered by a low pass filter to attenuate all of the resulting frequencies except the lowest difference frequency. The oscillator to be calibrated is adjusted until this difference frequency is as low as possible. In order to simplify the calibration of the crystal oscillator, the output of the low pass filter is coupled to a harmonic generator, such as a Schmitt trigger, which generates voltage transients for each cycle of the difference frequency. The output of the Schmitt trigger is applied to an amplifier and a speaker. The transient or pulses generated by the Schmitt trigger produce an audible output from the speaker even though the difference frequency applied to the Schmitt trigger is below the audible frequency range.

An embodiment of this invention for calibrating oscillators used in mobile telephone service is shown in the drawing. This system is given by way of illustration and the invention is not limited to this embodiment. In one mobile telephone band, extending from 157.77 megacycles to 158.07 megacycles, 11 channels are allocated, each channel being separated by 30 kilocycles. The crystal oscillators in the radio equipment used for this service are resonant at one-twelfth of the output frequencies, that is at frequencies from 13.1475 megacycles to 13.1725 megacycles with the frequency of the center channel oscillator being 13.1600 megacycles. The oscillator frequencies are separated by one-twelfth of 30 kilocycles or 2.5 kilocycles.

Referring to the figure a precision crystal oscillator 10, resonant at 3.29 megacycles, is used to provide an accurate and stable reference frequency. Oscillator 10 has substantially the same temperature characteristics as the crystal oscillators which are to be calibrated, and thus the calibration can be carried out without special corrections for temperature effects. The output of crystal oscillator 10 is amplified in buffer amplifier 11 and the frequency is multiplied in multiplier 12 to develop an output frequency of 13.1600 megacycles, which is the center frequency of the system being described. A second oscillator 15 generates 2.5 kilocycles, one-twelfth of the frequency difference between the channels. Oscillator 15 can be a tuning fork or resonant read oscillator and its accuracy and stability need not be as high as that of oscillator 10. The output of oscillator 15 and multiplier 12 are combined in the spectrum generator 16. Since the 2.5 kilocycle output of oscillator 15 is a very small percentage of the 13.1600 megacycle output of oscillator 10 any frequency error in the 2.5 kilocycle output of oscillator 15 will produce a negligible percentage error in the output frequency of spectrum generator 16.

The output of spectrum generator 16 is a frequency spectrum consisting of a series of discrete frequencies of 13.1600 megacycles plus or minus multiples of 2.5 kilocycles. In this example only the first five harmonics of 2.5 kilocycles are used giving an output frequency spectrum of 11 frequencies, from 13.1475 megacycles to 13.1725 megacycles, each frequency being separated from its adjacent frequency by 2.5 kilocycles. Thus the output of spectrum generator 16 consists of a series of frequencies corresponding to the frequencies at which oscillator 17 can be resonant. These frequencies are accurate and stable and the frequency to which it is desired to tune oscillator 17 is selected and compared with the output frequency of oscillator 17.

Oscillator 17 and spectrum generator 16 are coupled to mixer 18 which mixes the two signals and produces sum and difference frequencies thereof. The sum and difference frequencies are detected in detector 19 and then coupled to low pass filter and audio amplifier 20 which rejects all the sum and difference frequencies except the lowest frequency. The lowest frequency will be the difference frequency between the output of oscillator 17 and the closest frequency thereto which is present in the frequency spectrum generated by spectrum generator 16. This difference frequency is in the audio range and, since oscillator 17 has an error of less than 1 kilocycle, the output of the low pass filter and audio amplifier 20 will be 1,000 cycles or less. The frequency of oscillator 17 is adjusted until the difference frequency between the output of oscillator 17 and the desired frequency which is present in the output of spectrum generator 16 is substantially zero.

One method of monitoring the difference frequency output of low pass filter and audio amplifier 20 would be to listen to the audio output by means of earphones or a loud speaker. However, it is difficult to hear a signal which is less than 30 to 40 cycles in frequency and it is necessary to calibrate oscillator 17 more accurately. The output of audio amplifier 20 is coupled to Schmitt trigger 23. In operation Schmitt trigger 23 is pulsed by the individual cycles applied thereto from audio amplifier 20. The output of the Schmitt trigger 23 is a series of pulses rich in harmonics with a pulse repetition rate equal to the difference frequency applied thereto. When the fundamental difference frequency is less than the audible level, the harmonics of the pulses will still be within the audible range. Thus, it is possible to hear the transients at the difference frequency, even though the difference frequency is far below the audible range of the human ear. The output of Schmitt trigger 23 is amplified in amplifier 24 and applied to a speaker or a phone jack 25. By this means it is possible to use an audio output to calibrate oscillator 17 so that the difference between its output frequency and the calibration frequency of spectrum generator 16 is less than one cycle.

Thus, a simple means for calibrating a large number of crystals having discrete frequencies has been provided. The system is highly accurate in operation and the calibration can be simply and quickly accomplished. By making the temperature characteristics of the calibration crystal oscillator substantially the same as the temperature characteristics of the oscillator to be calibrated it is possible to calibrate unheated crystals over a wide temperature range.

I claim:

1. A system for calibrating the frequency of a crystal oscillator output signal which may have any one of a series of discrete frequencies, the frequencies in the series being separated by a fixed difference frequency, the system including in combination, first oscillator means for generating an output signal having a frequency in the series, second oscillator means for generating an output signal having a frequency substantially equal to the fixed difference frequency, spectrum generator means coupled to said first and second oscillator means and responsive to said output signals therefrom to develop a signal spectrum including the series of discrete frequencies, mixer means coupled to said spectrum generator means and adapted to receive the output signal from the crystal oscillator, said mixer means being responsive to the crystal oscillator output signal and said signal spectrum to develop a signal including a second series of difference frequency signals, and output means coupled to said mixer means for indicating the frequency of the lowest frequency one of said second series of difference frequency signals.

2. A system for calibrating the frequency of a crystal oscillator output signal which may have any one of a series of discrete frequencies, the frequencies in the series being separated by a fixed difference frequency, the system including in combination, first oscillator means for generating an output signal having a frequency in the series, second oscillator means for generating an output signal having a frequency substantially equal to the fixed difference frequency, spectrum generator means coupled to said first and second oscillator means and responsive to said output signals therefrom to develop a signal spectrum including the series of discrete frequencies, mixer means coupled to said spectrum generator means and adapted to receive the output signal from the crystal oscillator, said mixer means being responsive to the crystal oscillator output signal and said signal spectrum to develop a signal including a second series of difference frequency signals, detector and low pass filter means coupled to said mixer means and responsive to said second series of difference frequency signals to pass only the lowest frequency signal thereof, and output means coupled to said detector and low pass filter means for indicating the frequency of said lowest frequency signal.

3. A system for calibrating the frequency of a crystal oscillator output signal which may have any one of a series of discrete frequencies, the frequencies in the series being separated by a fixed difference frequency, the system including in combintion, first oscillator means for generating an output signal having a frequency in the series, second oscillator means for generating an output signal having a frequency substantially equal to the fixed difference frequency, spectrum generator means coupled to said first and second oscillator means and responsive to said output signals therefrom to develop a signal spectrum including the series of discrete frequencies, mixer means coupled to said spectrum generator means and adapted to receive the output signal from the crystal oscillator, said mixer means being responsive to the crystal oscillator output signal and said signal spectrum to develop a signal including a second series of difference frequency signals, detector and low pass filter means coupled to said mixer means and responsive to said second series of difference frequency signals to pass only the lowest frequency signal thereof, harmonic generation means coupled to said detector and low pass filter means and responsive to said lowest frequency signal to generate harmonic signals thereof, audio output means coupled to said harmonic generation means and responsive to said harmonic signals therefrom to develop an audio output signal.

4. A system for calibrating the frequency of a crystal oscillator output signal which may have any one of a series of discrete frequencies, the frequencies in the series being separated by a fixed difference frequency, the system including in combination, first oscillator means for generating an output signal having a frequency in the series and having a frequency versus temperature characteristic substantially the same as the crystal oscillator over a predetermined temperature range, tuning fork oscillator means for generating an output singal having a frequency substantially equal to the fixed difference frequency, spectrum generator means coupled to said first and said tuning fork oscillator means and responsive to said output signals therefrom to develop a signal spectrum including the series of discrete frequencies, a mixer means coupled to said spectrum generator means and adapted to recevie the output signal from the crystal oscillator, said mixer means being responsive to the crystal oscillator output signal and said signal spectrum to develop a signal including a second series of difference frequency signals, detector and low pass filter means coupled to said mixer means and responsive to said second series of difference frequency signals to pass only the lowest frequency signal thereof, harmonic generation means coupled to said detector and low pass filter means and responsive to said lowest frequency signal to generate harmonic signals thereof, audio output means coupled to said harmonic generation means and responsive to said harmonic signals therefrom to develop an audio output signal.

5. A system for calibrating the frequency of a first crystal oscillator output signal which may have any one of a series of discrete frequencies, the frequencies in the series being separated by a fixed difference frequency, the system including in combination, second crystal oscillator means for generating an output signal having a frequency in the series, and having a frequency versus temperature characteristic substantially the same as the crystal oscillator over a predetermined temperature range, tuning fork oscillator means for generating an output signal having a frequency substantially equal to the fixed difference frequency, spectrum generator means coupled to said second crystal and said tuning fork oscillator means, and responsive to said output signals therefrom to develop a signal spectrum including the series of discrete frequencies, mixer means coupled to said spectrum generator means and adapted to receive the output signal from the first crystal oscillator, said mixer means being responsive to the first crystal oscillator output signal and said signal spectrum to develop a signal including a second series of difference frequency signals, detector and low pass filter means coupled to said mixer means and responsive to said second series of difference frequency signals to pass only the lowest frequency signal thereof, Schmitt trigger means coupled to said detector and low pass filter means and responsive to said lowest frequency signal to generate harmonic signals thereof, audio output means coupled to said Schmitt trigger means and responsive to said harmonic signals therefrom to develop an audio output signal.

No references cited.

ROY LAKE, *Primary Examiner.*